United States Patent
Benson et al.

(10) Patent No.: US 11,189,484 B2
(45) Date of Patent: Nov. 30, 2021

(54) SEMICONDUCTOR NITRIDATION PASSIVATION

(71) Applicant: Micron Technology, Inc., Boise, ID (US)

(72) Inventors: Russell A. Benson, Boise, ID (US); Silvia Borsari, Boise, ID (US); Vinay Nair, Boise, ID (US); Ying Rui, Meridian, ID (US); Somik Mukherjee, Boise, ID (US)

(73) Assignee: Micron Technology, Inc., Boise, ID (US)

(*) Notice: Subject to any disclaimer, the term of this patent is extended or adjusted under 35 U.S.C. 154(b) by 165 days.

(21) Appl. No.: 16/723,557

(22) Filed: Dec. 20, 2019

(65) Prior Publication Data
US 2021/0193460 A1 Jun. 24, 2021

(51) Int. Cl.
H01L 21/02 (2006.01)
H01L 21/3213 (2006.01)
H01L 21/311 (2006.01)

(52) U.S. Cl.
CPC .... *H01L 21/02247* (2013.01); *H01L 21/0217* (2013.01); *H01L 21/02252* (2013.01); *H01L 21/31116* (2013.01); *H01L 21/32137* (2013.01)

(58) Field of Classification Search
None
See application file for complete search history.

(56) References Cited

U.S. PATENT DOCUMENTS

| | | | | |
|---|---|---|---|---|
| 5,925,577 A | * | 7/1999 | Solis | H01L 21/02071 438/725 |
| 6,006,764 A | * | 12/1999 | Chu | G03F 7/427 134/1.2 |
| 7,662,693 B2 | | 2/2010 | Bhattacharyya | |
| 7,875,529 B2 | | 1/2011 | Forbes et al. | |
| 8,274,777 B2 | | 9/2012 | Kiehlbauch | |
| 2013/0146953 A1 | * | 6/2013 | Cheng | H01L 27/1207 257/296 |
| 2016/0035861 A1 | * | 2/2016 | Park | H01L 21/32139 438/301 |
| 2018/0197730 A1 | * | 7/2018 | Sridhar | H01L 21/0234 |
| 2019/0019890 A1 | * | 1/2019 | Ko | H01L 23/535 |
| 2019/0088564 A1 | * | 3/2019 | Tai | H01L 24/20 |
| 2019/0259623 A1 | * | 8/2019 | Sridhar | H01L 21/02252 |
| 2019/0273042 A1 | * | 9/2019 | Cheng | H01L 23/49827 |
| 2020/0098639 A1 | * | 3/2020 | Seshadri | H01L 21/02118 |
| 2020/0283928 A1 | * | 9/2020 | Ohido | C30B 29/68 |

* cited by examiner

*Primary Examiner* — Evren Seven
(74) *Attorney, Agent, or Firm* — Brooks, Cameron & Huebsch, PLLC (57) ABSTRACT

Methods, apparatuses, and systems related to a semiconductor nitridation passivation are described. An example method includes performing a dry etch process on a semiconductor structure on a wafer in a semiconductor fabrication process. The method further includes performing a dry strip process on the semiconductor structure. The method further includes performing a first wet strip clean process on the semiconductor. The method further includes performing a second wet strip clean process on the semiconductor. The method further includes performing a nitridation passivation on the semiconductor structure to avoid oxidization of the semiconductor structure. The method further performing a spacer material deposition on the semiconductor structure.

24 Claims, 5 Drawing Sheets

SEMICONDUCTOR NITRIDATION PASSIVATION

TECHNICAL FIELD

The present disclosure relates generally to semiconductor devices and methods, and more particularly to a semiconductor nitridation passivation.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

BRIEF DESCRIPTION OF THE DRAWINGS

FIGS. 2A-3C illustrate a cross-sectional view of a portion of semiconductor structure of a memory device in examples of a semiconductor fabrication sequence for a semiconductor structure nitridation passivation in accordance with a number of examples of the present disclosure.

DETAILED DESCRIPTION

Various types of semiconductor structures on memory devices (e.g., those that include volatile or non-volatile memory cells) may include rectilinear trenches and/or round, square, oblong, etc., cavities that may be formed into semiconductor material to create openings thereon for subsequent semiconductor processing steps. Various materials may be deposited using chemical vapor deposition (CVD), plasma deposition, etc. and patterned using photolithographic techniques, doped and etched using vapor, wet and/or dry etch processes to form semiconductor structures on a working surface. Such openings may contain, or be associated with, various materials that contribute to data access, storage, and/or processing, or to various support structures, on the memory device. As an example, sense line contacts (e.g. bit line contacts) may be deposited into these openings to provide the data access, storage, and/or processing.

As design rules shrink, the margin for error in performance decreases. Critical dimensions become smaller and aspect ratios to openings in a semiconductor fabrication process becomes greater. In order to improve the conductivity of a cell of the memory device, a surface area of a semiconductor working surface formed into a column can be increased by increasing the height of the capacitor material column. Increasing the distance between adjacent capacitor columns can increase conductivity and capacitance. Spacer material depositions may be used to increase the pitch/distance between capacitor columns, sense lines and sense line contacts. However, the spacer material depositions may consume the materials within the plurality of sense line pillars that form the sense line contacts.

Consumption of the sense line contacts, particularly the polysilicon material at the bottom of the pillar may increase a sense line contact resistivity. Residuals from the plurality of sense line pillars may also interfere with the conductivity of the semiconductor structure and may cause shorts.

In order to mitigate this issue, a method for a semiconductor nitridation passivation is described further below. As an example, dry etch process may be performed on a semiconductor structure to shape the semiconductor structure. A dry strip process may also be performed, followed by a first wet strip clean and a second wet strip clean process. A spacer material deposition may then be performed on the semiconductor structure. A nitridation passivation may be performed on the semiconductor structure prior to the spacer material deposition to prevent oxidation and/or loss of critical dimension to the semiconductor structure. The nitridation passivation may occur multiple times during semiconductor processing steps and/or storage between steps in a fabrication sequence.

The present disclosure includes methods, apparatuses, and systems related to a semiconductor nitridation passivation. Previous approaches have attempted to protect the semiconductor structure from consumption through oxidation of the semiconductor structure while increasing the resistivity of the structure but have been unsuccessful in accomplishing both. Here, the nitridation passivation may protect the semiconductor structure from oxidation as well consumption during a spacer material deposition and may also nitridize residues/foots from the plurality of sense line pillars.

In one example, conductivity may be increased and resistivity decreased through the widened semiconductor structure width. The semiconductor structure may be by way of example and not by way of limitation, a sense line contact structure, including polysilicon material. An example method includes performing a dry etch process on a semiconductor structure on a wafer in a semiconductor fabrication process. The method further includes performing a dry strip process on the semiconductor structure. The method further includes performing a first wet strip clean process on the semiconductor. The method further includes performing a second wet strip clean process on the semiconductor. The method further includes performing a nitridation passivation on the semiconductor structure to avoid oxidization of the semiconductor structure. The method further performing a spacer material deposition on the semiconductor structure.

In the following detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 203 may reference element "03" in FIG. 2, and a similar element may be referenced as 303 in FIG. 3. In some instances, a plurality of similar, but functionally and/or structurally distinguishable, elements or components in the same figure or in different figures may be referenced sequentially with the same element number (e.g., 209-1, 209-2, 209-3 in FIG. 2).

Figure 1:
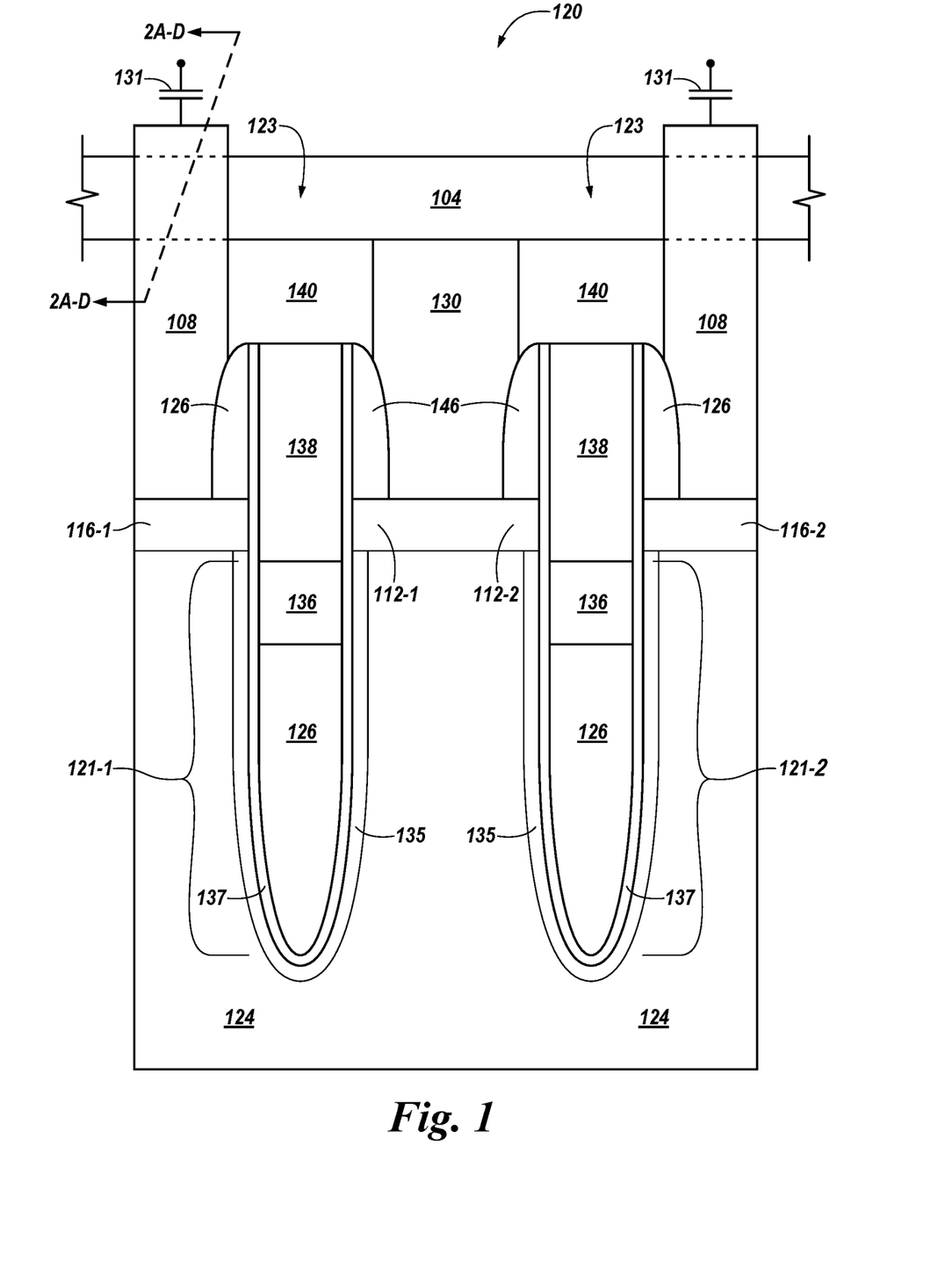
FIG. 1 illustrates an example cross-sectional side view of a memory cell in accordance with a number of embodiments of the present disclosure.

FIG. 1 illustrates a cross-sectional view 100 of an apparatus 120 showing a pair of neighboring memory cells sharing a source/drain region, e.g., 112-1 and 112-2, and a sense line contact 130 connecting to a passing sense line 104. The pair of neighboring memory cells include access devices 123-1, 123-2 (hereinafter referred to individually or collectively as access devices 123) coupled to storage node contacts 108-1, 108-2 (hereinafter referred to individually or collectively as storage note contacts 108) and storage nodes 131-1, 131-2 (hereinafter referred to individually or collectively as storage nodes 131) in accordance with a number of embodiments of the present disclosure.

The access devices 123 include gates 121-1, 121-2, individually or collectively referred to as gates 121. The gates 121 may also be referred to as a gate electrode. The access devices 123 may include recessed access devices, e.g., a buried recessed access device (BRAD). In the example shown, the gate 121 may include a first portion 126 including a metal containing material, e.g., titanium nitride (TiN), and a second portion 136 including a doped polysilicon to form a hybrid metal gate (HMG) 121. The gate 121 may be separated from a channel 135 by a gate dielectric 137. The gate 121 separates a first source/drain region 116-1 and 116-2, collectively referred to as first source/drain region 116, and a second source/drain region 112-1 and 112-2, collectively referred to as second source/drain region 112. In the example of FIG. 1, two neighboring access devices 123 are shown sharing a second source/drain region 112 at a junction. The neighboring access devices 123 may be formed on a working surface of a semiconductor material on a substrate 124.

In the example of FIG. 1, a storage node 131 (shown schematically for ease of illustration) is connected to a storage node contact 108 formed in accordance with the techniques described herein. The storage node contact 108 may be connected to an active area, e.g., a first source/drain region 116 of an access device 123. An insulation material 140 (e.g., a dielectric material) may be formed on the spacer material 146 and the gate mask material 138, and in contact with a conductive material 130 serving as a sense line contact 130. The sense line contact 130 may be connected to a sense line 104, e.g., passing sense line orthogonal to a directional orientation of access lines connecting to gates 121 of the access devices 123. In the example illustration of FIG. 1, the illustrated passing sense line 104 is actually recessed into the page, parallel to the plane of the drawing sheet so as to be offset a particular depth from the storage nodes 131. Access lines connected to gates 121 may be running perpendicular to a plane of the drawing sheet, e.g., coming out of the page.

In some embodiments the sense line contact 130 may be a metallic material, e.g., Tungsten (W). The insulation material 140 may be formed on the spacer material 146 and the gate mask material 138, and in contact with the conductive sense line material 130.

Figure 2A:
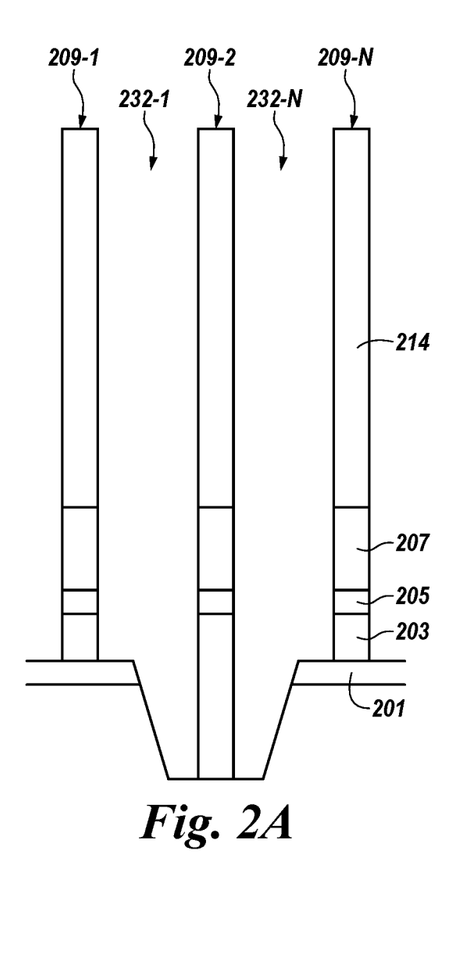

FIG. 2A illustrates a cross-sectional view 211 of a portion of semiconductor structure of a memory device in association with a semiconductor fabrication sequence for a semiconductor structure nitridation passivation in accordance with a number of examples of the present disclosure.

The example memory device can include a plurality of sense line pillars 209-1, 209-2, . . . , 209-N (hereinafter referred to collectively as plurality of sense line pillars 209). Each of the plurality of sense line pillars 209 may include a silicate material 203, shown to have been formed on an underlying working surface 201.

The working surface 201 may be formed from various undoped or doped materials on which memory device materials may be fabricated. Examples of a relatively inert undoped working surface 201 may include monocrystalline silicon (monosilicon), polycrystalline silicon (polysilicon), and amorphous silicon, among other possibilities. The working surface 201 may also be formed from an oxide material selected for dielectric properties.

The silicate material 203 may, in a number of examples, have been formed from a), polycrystalline silicon (polysilicon). The silicon compound may be silicon dioxide ($SiO_2$), which may be formed by oxidation of silane ($SiH_4$), among other possibilities. The silicon compound may also include monocrystalline silicon (monosilicon) and amorphous silicon, among other possibilities. The silicate material 203 may be undoped except as needed to connect with the sense line contact.

The silicate material 203 may be originally formed (e.g., deposited) over a surface of the underlying working surface 201. The silicate material 203 may be formed (e.g., deposited) as a single layer on an upper surface of the working surface 201. Alternatively, the silicate material 203 may be formed (e.g., deposited) as two separate portions (e.g., layers) on the upper surface of the working surface 201. For example, the silicate material 203 may be formed with an opening (such as the opening illustrated between the plurality of sense line pillars 209-1 and 209-2 in FIG. 2, illustrated as pillars in this 2-dimensional format but not necessarily pillars in a 3-dimensional format, for example) formed therein from an upper surface of the working surface 201 to an upper surface of a barrier material 205.

A barrier material 205 may be formed over a surface of the silicate material 203 opposite from the underlying working surface 201. The barrier material 205 may be formed (e.g., deposited) over an upper surface of the silicate material 203. The barrier material 205 may be formed from a metal material. The barrier material 205 may be formed from transition metals such as tungsten (W), rhenium (Re), osmium (Os), iridium (Ir), platinum (Pt), titanium (Ti), zirconium (Zr), chromium (Cr), ruthenium (Ru), and palladium (Pd), among other possibilities.

A metal material 207 may be formed over a surface of the barrier material 205 opposite from the underlying silicate material 203. The metal material 207 may be formed (e.g., deposited) over an upper surface of the barrier material 205. The metal material 207 may be formed from a metal material selected for conductive properties. The metal material 207 may be formed from materials similar to the barrier material 205. The metal material 207 may be formed from transition metals such as tungsten (W), rhenium (Re), osmium (Os), iridium (Ir), platinum (Pt), titanium (Ti), zirconium (Zr), chromium (Cr), ruthenium (Ru), and palladium (Pd), among other possibilities.

A nitride material 214 may be formed over a surface of the metal material 207 opposite from barrier material 205. The nitride material 214 may be formed (e.g., deposited) over an upper surface of the metal material 207. The nitride material 214 may be formed from a nitride material selected for dielectric properties For example, one or more dielectric and/or resistor nitrides may be selected from boron nitride (BN), silicon nitride (SiNX, Si3N4), aluminum nitride (AlN), gallium nitride (GN), tantalum nitride (TaN, Ta2N), titanium nitride (TiN, Ti2N), and tungsten nitride (WN, W2N, WN2), among other possibilities, for formation of the nitride material 214.

An etch process (e.g., a first wet etch process or dry etch process) may be utilized to etch via (e.g., through) the silicate material 203, the barrier material 205, the metal material 207, and/or the nitride material 214 to form an opening within the previously listed materials (as is illustrated already between plurality of sense line pillars 209-1 and 209-2). Performance of the etch process may result in formation of a column of capacitor material in an opening through any combination of the plurality of sense line pillars 209 in order to form a resultant opening 232 that extends from the upper surface of the nitride material 214 to the surface of the working surface 201.

The resultant opening 232 may have a height in a range of from around 100 Angstroms (or 10 nm) to around 800 Angstroms (or 80 nm). The openings 232-1 . . . 232-N (hereinafter referred to collectively as opening 209) may span the length of the plurality of sense line pillars 209. In at least one example, the width or diameter for openings 232, between the plurality of sense line pillars 209 may be within a range of approximately 50-150 Angstroms (or 5 to 15 nm). Each of the materials (the silicate material 203, the barrier material 205, the metal material 207, and the nitride material 214) can contribute a particular height to the overall height of the structure.

Figure 2B:
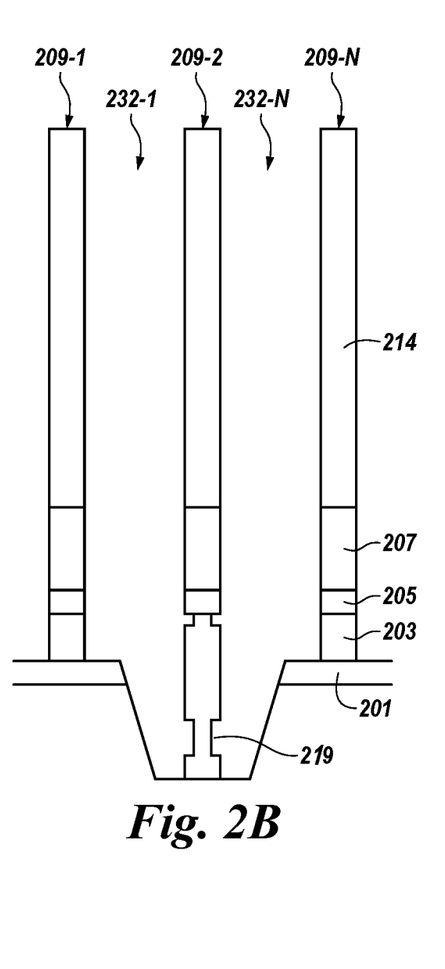

FIG. 2B illustrates a cross-sectional view 280 of a portion of semiconductor structure of a memory device in an example of a semiconductor fabrication sequence for a semiconductor structure nitridation passivation in accordance with a number of examples of the present disclosure. FIG. 2B illustrates the example semiconductor structure at a particular stage following completion of the example fabrication sequence described in connection with FIG. 2A.

As DRAM devices scale smaller, the width of the sense line pillars 209 becomes smaller increasing the resistivity of the sense lines. In some embodiments, a non-conductive spacer material deposition may be used to increase the surface area of the semiconductor structure. A spacer material may be deposited on the upper surfaces of the semiconductor structure to widen the space between the plurality of sense line pillars 209. The plurality of sense line pillars 209 may form a conductive pathway including a sense line contact.

The spacer material deposition may form also an isolation pathway for the semiconductor structure. The spacer material deposition may form an isolation layer for the plurality of sense line pillars 209. The spacer material deposition may be formed from an oxide material. The spacer material deposition may be deposited from the upper surface of the nitride material 214 to the upper surface of the working surface 201. The spacer material deposition may be used to straighten the openings 232 and increase the width between the plurality of sense line pillars 209. That is, the spacer material deposition may be used to pattern the openings 232 vertically.

The spacer material deposition may include molecular hydrogen ($H_2$) to reduce the metal material 207. In one example, a Tungsten Oxide material (WOx) may be reduced back into Tungsten (W). However, the molecular hydrogen may also etch away the silicate material 203. Deformation 219 may occur as the semiconductor structure waits to be processed. The molecular hydrogen may etch the silicate material 203 when there is no oxidation layer. The deformation 219 may occur as the molecular hydrogen etches away a portion of the silicate material 203. The deformation 219 of the silicate material 203 may interfere with the pathway to the sense line contact. The deformation 219 of the silicate material 203 may lead to an increase in sense line contact resistance.

Figure 2C:
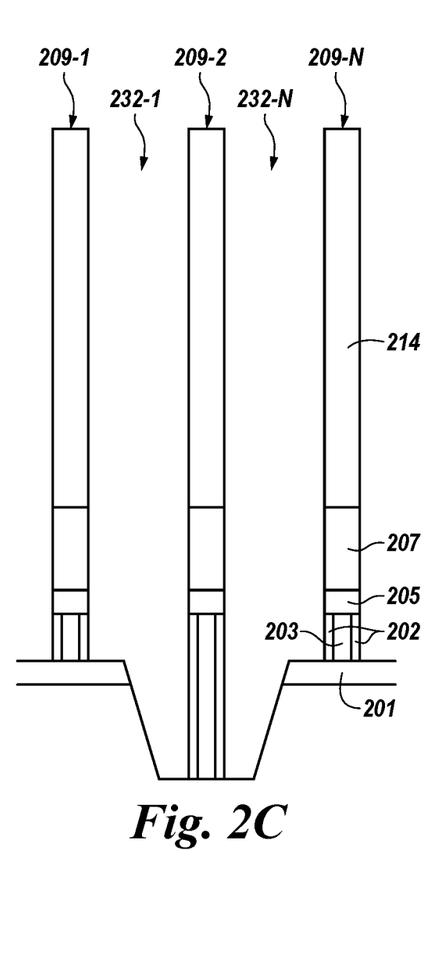

FIG. 2C illustrates a cross-sectional view 282 of a portion of semiconductor structure of a memory device in another example of a semiconductor fabrication sequence for a semiconductor structure nitridation passivation in accordance with a number of examples of the present disclosure.

Previous approaches have attempted to provide an additional barrier material 202 to the silicate material 203 during the spacer material deposition. The additional barrier material 202 uses native oxidation on the silicate material 203. However, the native oxidation consumes some of the silicate material 203 material.

The additional barrier material 202 may be directed towards the bottom surfaces of the semiconductor structure. The additional barrier material 202 may be directed towards the silicate material 203 to combat the effects of the spacer material deposition. The additional barrier material 202 may be directed towards the upper surface of the silicate material 203 to the upper surface of the working surface 201. The additional barrier material 202 may protect the plurality of sense line pillars 209 from being etched by the molecular hydrogen. However, the additional barrier material 202 may cause oxidization of the silicate material 203 prior to the spacer material deposition. The oxidization from the additional barrier material 202 may cause the silicate material 203 to lose additional material. That is, oxidization from the additional barrier material 202 may cause the silicate material 203 to lose the portion of the material covered by the additional barrier material 202. The loss in silicate material 203 may lead to an increase in sense line contact resistance.

Figure 3A:
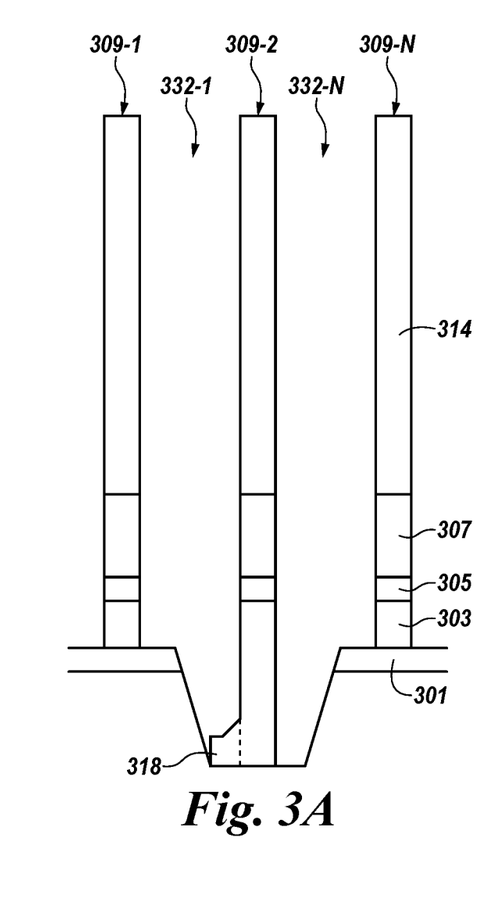

FIG. 3A illustrates a cross-sectional view 315 of a portion of semiconductor structure of a memory device in another example of a semiconductor fabrication sequence for semiconductor structure nitridation passivation in accordance with a number of examples of the present disclosure.

The cross-sectional view 315 can include the same or similar elements as the example cross-sectional views 100, 211, 280, and 282 as referenced in FIGS. 1, 2A, 2B, and 2C respectively. For example, the working surface 301 is analogous or similar to working surface 201 of FIGS. 2A, 2B, and 2C. The silicate material 303 is analogous or similar to first silicate material 203 of FIGS. 2A, 2B, and 2C. The barrier material 305 is analogous or similar to barrier material 205 of FIGS. 2A, 2B, and 2C. The metal material 307 is analogous or similar to metal material 207 of FIGS. 2A, 2B, and 2C. The nitride material 314 is analogous or similar to second nitride material 214 of FIGS. 2A, 2B, and 2C. The additional barrier material 302 is analogous or similar to additional barrier material 202 of FIG. 2C. The plurality of sense line pillars 309 is analogous or similar to plurality of sense line pillars 209 of FIGS. 2A, 2B, and 2C. The openings 332 is analogous or similar to plurality of sense line pillars 232 of FIGS. 2A, 2B, and 2C.

During the formation of the plurality of sense line pillars 309, a residue of the silicate material 303 may spread onto the upper surface of the working surface 301. The portion of the silicate material 303 may create a foot 318 for the silicate material 303. The silicate material foot 318 may be created on the bottom surface of the silicate material 303. The silicate material foot 318 may result in an electrical short from capacitor structure to sense line structure.

Figure 3B:
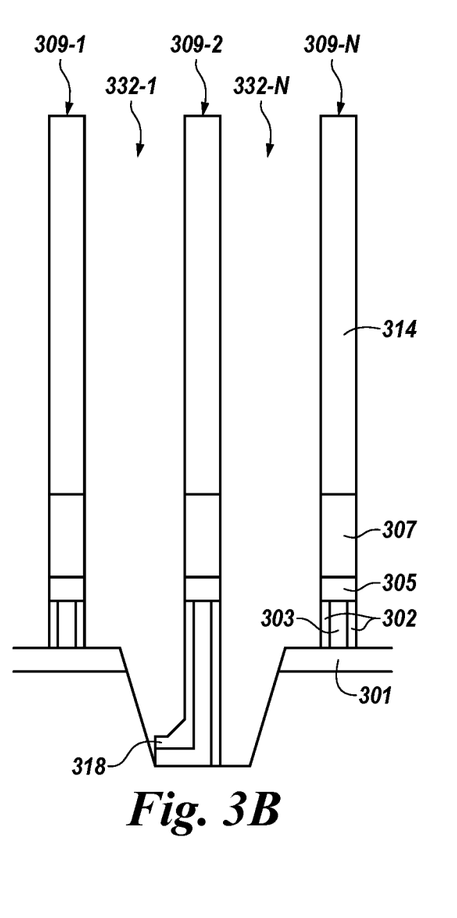

FIG. 3B illustrates a cross-sectional view 384 of a portion of semiconductor structure of a memory device in another example of a semiconductor fabrication sequence for semiconductor structure nitridation passivation in accordance with a number of examples of the present disclosure. FIG. 3B illustrates the example semiconductor structure at a particular stage following completion of the example fabrication sequence described in connection with FIG. 3A.

Previous approaches have attempted to remove the silicate material foot 318 by oxidation. An additional barrier material 302, formed from an oxide material, may be deposited on the semiconductor structure to oxidize the silicate material foot 318. The additional barrier material 302 may be deposited on the bottom surfaces of the semiconductor structure. The additional barrier material 302 may be deposited on the silicate material 303 to protect it from the molecular hydrogen ($H_2$) within the spacer material deposition.

The additional barrier material 302 may be deposited from the upper surface of the silicate material 303 to the upper surface of the working surface 301. The additional barrier material 302 may be deposited in the openings 332 between the plurality of sense line pillars 309 from the upper surface of the silicate material 303 to the upper surface of the working surface 301 to ensure coverage of the silicate material foot 318. However, in previous approaches the additional barrier material 202 have been insufficient to oxidize the silicate material foot 318. A portion of the silicate material foot 318 may be oxidized by the additional barrier material 302. The unoxidized portion of the silicate material foot 318 may reduce the pitch/space between the plurality of sense line pillars 309, which may lead to reduction in conductivity and possibly shorts.

Figure 3C:
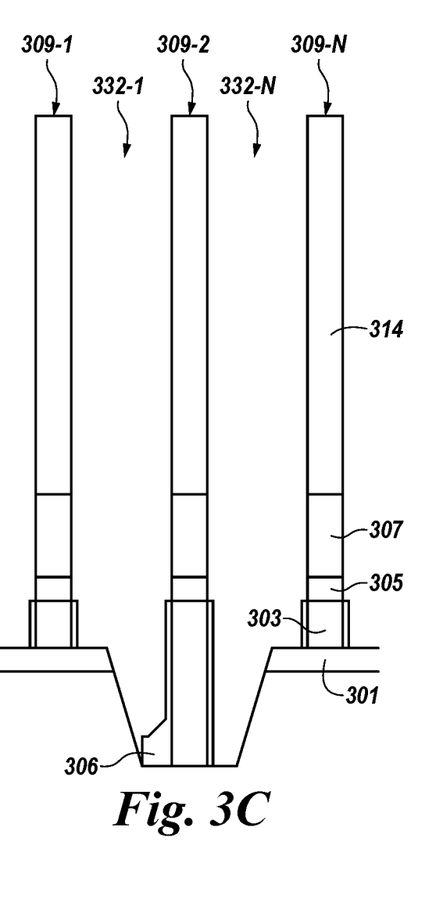

FIG. 3C illustrates a cross-sectional view 386 of a portion of semiconductor structure of a memory device in another example of a semiconductor fabrication sequence for semiconductor structure nitridation passivation in accordance with a number of examples of the present disclosure. FIG. 3C illustrates the example semiconductor structure at a particular stage following completion of the example fabrication sequence described in connection with FIG. 3A.

A nitridation passivation process 306 may be employed to decrease etching away of the silicate material 303 by the molecular hydrogen and decrease sense line contact resistance while completely nitridizing the silicate material foot 318. The nitridation material may be formed from a dintrogen ($N_2$) plasma. The semiconductor structure may be purged with dintrogen to remove residual gases such as oxygen. A passivation process may be added to the dinitride purge process. As used herein, "passivation" may refer to the process of treating or coating a surface in order to reduce the chemical reactivity of its surface. Here, the dinitride material passivates the plurality of sense line pillars 309 from oxidization during the spacer material deposition process. In some examples, a nitridation passivation process 306 similar to the remote plasma nitridation (RPN) may be used. In other examples, a nitridation passivation process 306 similar to the decoupled plasma nitridation (DPN) may also be used.

The nitridation passivation process 306 may occur during semiconductor processing. The nitridation passivation process 306 may occur while the semiconductor structure waits to be processed. The semiconductor structure may be stored in a Front Opening Universal Pod (FOUP) while waiting to be processed. The nitridation passivation process 306 may occur within the FOUP. The nitridation passivation process 306 may protect the semiconductor structure from native oxygen while waiting within the FOUP. The nitridation passivation process 306 may prevent oxidization of the silicate material 303.

In one example, the nitridation passivation may be deposited onto the semiconductor structure. immediately before the spacer material deposition. That is, a dry etch process may be performed on the semiconductor structure, then a dry strip process followed by a first wet strip clean and a second wet strip clean process and then the nitridation passivation process 306, followed by the spacer material deposition.

A dry etch may be subsequently used to etch a portion of the materials within the plurality of sense line pillars 109. The dry etch may be carried out using plasma. The dry etch plasma may be formed from bromous (HBr/O2) acid. The dry etch process may be followed by a dry strip process. A dry strip process may be carried out using a dry etch plasma. The dry etch strip chemistry may comprise of a mixture of nitrogen gas (N2) and hydrogen gas (H2).

The dry etch strip process may be followed by a first wet strip clean and a second wet strip clean process. The wet strip clean processes may be carried out using a wet etch. The wet etch may be carried out using a dilute hydrofluoric (HF) acid combination. The first wet strip process may contain a dilution at a ratio between 1500 to 2500 parts water to 1 part acid. The second wet strip process may contain a dilution at a ratio between 100 to 500 parts water to 1 part acid. The second wet strip clean process may be followed by the nitridation passivation process and then by the spacer material deposition.

In another example, the nitridation passivation process 306 may occur after the first wet strip clean process on the semiconductor structure. That is, a dry etch process may be performed on the semiconductor structure, then a dry strip process followed by a first wet strip clean process, and then the nitridation passivation process 306, after which the second wet strip clean process will be performed followed by the spacer material deposition.

In one example, the nitridation passivation process 306 may occur multiple times. For example, the nitridation passivation process 306 may occur after the dry strip process and also after the wet strip clean process. That is, a dry etch process may be performed on the semiconductor structure, then a dry strip process followed by a first nitridation passivation, and then the first wet strip clean process, after which a second nitridation passivation process will be performed, followed by the second wet strip clean process and then the spacer material deposition. The nitridation passivation process 306 may occur as needed while the semiconductor structure waits in the FOUP.

In some examples, an elevated temperature anneal process may occur after a nitridation passivation process 306 within the semiconductor structure. That is, the elevated temperature dilution may occur after the first nitridation passivation. The elevated temperature dilution may also occur after the second nitridation passivation. The anneal process may have an elevated temperature ranging from 500 to 1200 degrees Celsius.

The nitridation passivation process 306 may be effective at passivating horizontal surfaces. The nitridation passivation process 306 may be targeted toward the bottom of the semiconductor structure. As such, the nitridation passivation process 306 may target the silicate material foot (318 as illustrated in FIGS. 3A and 3B) at the bottom of semiconductor structure. The silicate material foot is completely nitridized and become non-conductive during the nitridation passivation process 306. The non-conductive foot may no longer pose a risk of electrical shorts from capacitor structure to sense line structure. The removal of the silicate material foot may improve protection of the semiconductor structure against potential shorts by a range between 40% to 80%. The removal of all silicate material residue may also decrease sense line contact resistivity by a range between 4% to 15%.

Figure 4:
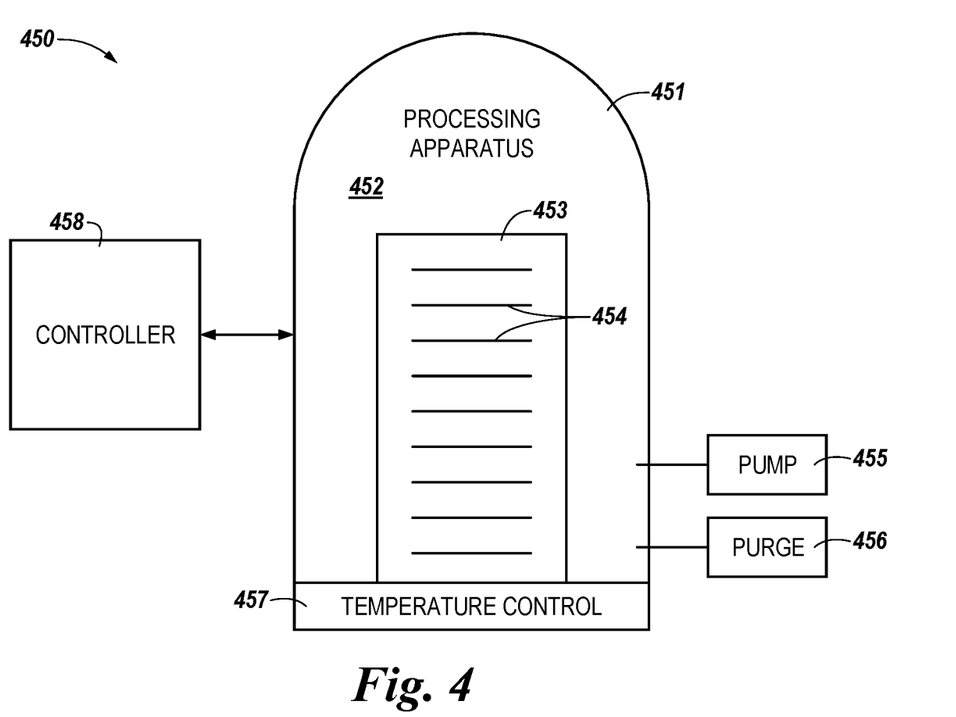
FIG. 4 is a functional block diagram of a computing system for implementation of an example semiconductor fabrication process in accordance with a number of embodiments of the present disclosure.

FIG. 4 illustrates an example processing apparatus 451 that may be used in a semiconductor fabrication process. The processing apparatus 451 may include a chamber 452 to enclose components configured to perform deposition and/or etch operations on a number of semiconductor devices. The chamber 452 may further enclose a carrier 453 to hold a batch of semiconductor wafers 454. The processing apparatus 451 may include and/or be associated with tools including, for example, a pump 455 unit and a purge 456 unit configured to introduce and remove appropriate etch chemistries, as described herein, at each point in the semiconductor fabrication sequence. The processing apparatus 451 may further include a temperature control 457 unit configured to maintain the chamber 452 at an appropriate temperature at each of the points in the fabrication sequence. The system 450 may include a number of chambers 452 that are each configured to perform particular processes (e.g., a wet etch process, a dry etch process, and/or a deposition process, among others) during the fabrication sequence.

The system 450 may further include a controller 458. The controller 458 may include, or be associated with, circuitry and/or programming for implementation of, for instance, nitridation passivation on a semiconductor structure. The material may be grown to a size that seals the non-solid space adjacent the storage node contact. Adjustment of such deposition, removal, and etching operations by the controller 458 may control the critical dimensions (CDs) of the semiconductor devices created in the processing apparatus 451.

A host may be configured to generate instructions related to nitridation passivation on a semiconductor structure. The instructions may be sent via a host interface to the controller 458 of the processing apparatus 451. The instructions may be based at least in part on scaled preferences (e.g., in numerically and/or structurally defined gradients) stored by the host, provided via input from another storage system (not shown), and/or provided via input from a user (e.g., a human operator), among other possibilities. The controller 458 may be configured to enable input of the instructions and scaled preferences to define the CDs of the fabrication of the semiconductor device to be implemented by the processing apparatus 451.

The scaled preferences may determine final structures (e.g., the CDs) of passing sense lines and storage node contact. Particular CDs may be enabled by the particular scaled preferences that are input via the instructions. Receipt and implementation of the scaled preferences by the controller 458 may result in corresponding adjustment, by the processing apparatus 451, of a deposition time for the nitridation passivation process, adjustment of a coverage area, height, and/or volume of the nitridation passivation material, among implementation of other possible scaled preferences.

The controller 458 may, in a number of embodiments, be configured to use hardware as control circuitry. Such control circuitry may, for example, be an application specific integrated circuit (ASIC) with logic to control fabrication steps, via associated deposition and etch processes, nitridation passivation on a semiconductor structure. The controller 458 may be configured to receive the instructions and direct performance of operations to perform a nitridation passivation on a semiconductor structure as described in connection with FIG. 1-3.

Figure 5:
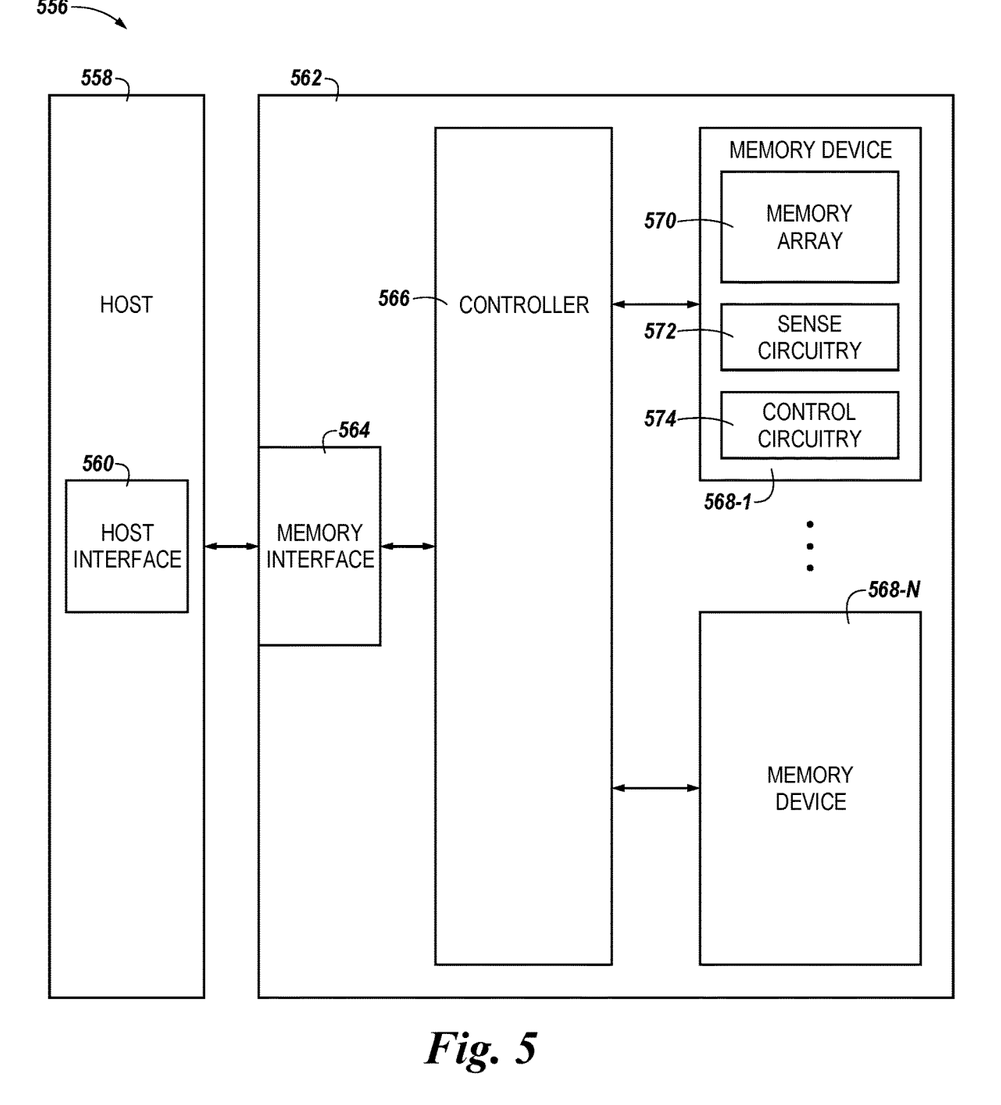
FIG. 5 is a functional block diagram of a computing system including at least one memory array having memory cells formed in accordance with a number of embodiments of the present disclosure.

FIG. 5 is a functional block diagram of a computing system 556 including at least one memory system 562 in accordance with one or more embodiments of the present disclosure. The numbering convention used in connection with FIG. 5 does not follow the earlier introduced numbering convention and sequence that applies to FIGS. 1-3. Memory system 562 may be, for example, a solid-state drive (SSD).

In the embodiment illustrated in FIG. 5, memory system 562 includes a memory interface 564, a number of memory devices 568-1, . . . 568-N, and a controller 566 selectably coupled to the memory interface 564 and memory devices 568-1, . . . 568-N. Memory interface 564 may be used to communicate information between memory system 562 and another device, such as a host 558. Host 558 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, PDAs, memory card readers, interface hubs, and the like. Such a host 558 may be associated with fabrication operations performed on semiconductor devices and/or SSDs using, for example, a processing apparatus shown at 551 and described in connection with FIG. 5.

In a number of embodiments, host 558 may be associated with (e.g., include or be coupled to) a host interface 560. The host interface 560 may enable input of scaled preferences (e.g., in numerically and/or structurally defined gradients) to define, for example, critical dimensions (CDs) of a final structure or intermediary structures of a memory device (e.g., as shown at 568) and/or an array of memory cells (e.g., as shown at 570) formed thereon to be implemented by the processing apparatus 551. The array includes access devices having nitridation passivation on a semiconductor structure according to embodiments described herein. The scaled preferences may be provided to the host interface 560 via input of a number of preferences stored by the host 558, input of preferences from another storage system (not shown), and/or input of preferences by a user (e.g., a human operator).

Memory interface 564 may be in the form of a standardized physical interface. For example, when memory system 562 is used for information (e.g., data) storage in computing system 556, memory interface 564 may be a serial advanced technology attachment (SATA) interface, a peripheral component interconnect express (PCIe) interface, or a universal serial bus (USB) interface, among other physical connectors and/or interfaces. In general, however, memory interface 564 may provide an interface for passing control, address, information, scaled preferences, and/or other signals between the controller 566 of memory system 562 and a host 558 (e.g., via host interface 560).

Controller 566 may include, for example, firmware and/or control circuitry (e.g., hardware). Controller 566 may be operably coupled to and/or included on the same physical device (e.g., a die) as one or more of the memory devices 568-1, . . . 568-N. For example, controller 566 may be, or may include, an ASIC as hardware operably coupled to circuitry (e.g., a printed circuit board) including memory interface 564 and memory devices 568-1, . . . 568-N. Alternatively, controller 566 may be included on a separate physical device that is communicatively coupled to the physical device (e.g., the die) that includes one or more of the memory devices 568-1, . . . 568-N.

Controller 566 may communicate with memory devices 568-1, . . . 568-N to direct operations to sense (e.g., read), program (e.g., write), and/or erase information, among other functions and/or operations for management of memory cells. Controller 566 may have circuitry that may include a number of integrated circuits and/or discrete components. In a number of embodiments, the circuitry in controller 566 may include control circuitry for controlling access across memory devices 568-1, . . . 568-N and/or circuitry for providing a translation layer between host 558 and memory system 562.

Memory devices 568-1, . . . 568-N may include, for example, a number of memory arrays 570 (e.g., arrays of volatile and/or non-volatile memory cells). For instance, memory devices 568-1, . . . 568-N may include arrays of memory cells, such as a portion of an example memory device structured to include storage node contacts. At least one array includes an access device having a storage node contact formed according to the embodiments disclosed herein. As will be appreciated, the memory cells in the memory arrays 570 of memory devices 568-1, . . . , 568-N may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory device 568 may be formed on the same die. A memory device (e.g., memory device 568-1) may include one or more arrays 570 of memory cells formed on the die. A memory device may include sense circuitry 572 and control circuitry 574 associated with one or more arrays 570 formed on the die, or portions thereof. The sense circuitry 572 may be utilized to determine (sense) a particular data value (e.g., 0 or 1) that is stored at a particular memory cell in a row of an array 570. The control circuitry 574 may be utilized to direct the sense circuitry 572 to sense particular data values, in addition to directing storage, erasure, etc., of data values in response to a command from host 558 and/or host interface 560. The command may be sent directly to the control circuitry 574 via the memory interface 564 or to the control circuitry 574 via the controller 566.

The embodiment illustrated in FIG. 5 may include additional circuitry that is not illustrated so as not to obscure embodiments of the present disclosure. For example, memory device 568 may include address circuitry to latch address signals provided over I/O connectors through I/O circuitry. Address signals may be received and decoded by a row decoder and a column decoder to access a memory array 570. It will be appreciated that the number of address input connectors may depend on the density and/or architecture of memory devices 568 and/or memory arrays 570.

In the above detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

It is to be understood that the terminology used herein is for the purpose of describing particular examples only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example examples including various combinations and configurations of semiconductor materials, underlying materials, structural materials, dielectric materials, capacitor materials, working surface materials, silicate materials, nitride materials, buffer materials, etch chemistries, etch processes, solvents, memory devices, memory cells, sidewalls of openings and/or trenches, among other materials and/or components related to a semiconductor structure nitridation passivation have been illustrated and described herein, examples of the present disclosure are not limited to those combinations explicitly recited herein. Other combinations and configurations of the semiconductor materials, underlying materials, structural materials, dielectric materials, capacitor materials, substrate materials, working surfaces, silicate materials, nitride materials, buffer materials, etch chemistries, etch processes, solvents, memory devices, memory cells, sidewalls of openings and/or trenches related to a semiconductor structure nitridation passivation than those disclosed herein are expressly included within the scope of this disclosure.

Although specific examples have been illustrated and described herein, those of ordinary skill in the art will appreciate that an arrangement calculated to achieve the same results may be substituted for the specific examples shown. This disclosure is intended to cover adaptations or variations of one or more examples of the present disclosure. It is to be understood that the above description has been made in an illustrative fashion, and not a restrictive one. Combination of the above examples, and other examples not specifically described herein will be apparent to those of skill in the art upon reviewing the above description. The scope of the one or more examples of the present disclosure includes other applications in which the above structures and processes are used. Therefore, the scope of one or more examples of the present disclosure should be determined with reference to the appended claims, along with the full range of equivalents to which such claims are entitled.

In the foregoing Detailed Description, some features are grouped together in an example for the purpose of streamlining the disclosure. This method of disclosure is not to be interpreted as reflecting an intention that the disclosed examples of the present disclosure have to use more features than are expressly recited in each claim. Rather, as the following claims reflect, inventive subject matter lies in less than all features of a disclosed example. Thus, the following claims are hereby incorporated into the Detailed Description, with each claim standing on its own as a separate example.

What is claimed is:

1. A method, comprising:
    performing a dry etch process on a semiconductor structure on a wafer in a semiconductor fabrication process;
    performing a dry strip process on the semiconductor structure;
    performing a first wet strip clean process on the semiconductor structure;
    performing a second wet strip clean process on the semiconductor structure;
    performing a nitridation passivation on the semiconductor structure to avoid oxidization of the semiconductor structure; and
    performing a spacer material deposition on the semiconductor structure.

2. The method of claim 1, further comprising forming the spacer material deposition from an oxide material.

3. The method of claim 1, further comprising forming the semiconductor structure from a silicate material.

4. The method of claim 3, further comprising protecting the silicate material from oxidation by performing the nitridation passivation.

5. The method of claim 3, further comprising nitridizing a residue formed from the silicate material between semiconductor pillars.

6. The method of claim 1, wherein performing the spacer deposition includes forming an isolation layer on the semiconductor structure.

7. The method of claim 1, further comprising forming a conductive pathway to a sense line contact.

8. The method of claim 7, further comprising improving resistivity of the sense line contact by a range between 4% to 15%.

9. The method of claim 1, further comprising forming the semiconductor structure to a height of a range between 100 and 800 Angstroms.

10. The method of claim 1, further comprising forming the semiconductor structure to a width of a range between 50 and 150 Angstroms.

11. The method of claim 1, further comprising forming the spacer material deposition to include molecular hydrogen ($H_2$).

12. A method, comprising:
    flowing a dry etch process on a semiconductor structure on a wafer in a semiconductor fabrication process;
    flowing a dry strip process on the semiconductor structure;
    flowing a first wet strip clean process on the semiconductor structure;
    flowing a nitridation passivation on the semiconductor structure to avoid oxidization of the semiconductor structure;
    flowing a second wet strip clean process on the semiconductor structure; and
    flowing a spacer material deposition on the semiconductor structure.

13. The method of claim 12, further comprising performing the nitridation passivation protects the semiconductor structure against native oxidation.

14. The method of claim 12, further comprising improving protection of the semiconductor structure against shorts by a range between 40% to 80%.

15. The method of claim 12, further comprising forming the dry etch process, and the dry strip process out of plasma.

16. The method of claim 12, further comprising forming the dry etch strip clean process from diazene plasma.

17. The method of claim 12, further comprising forming the nitridation passivation from a remote plasma nitridation (RPN).

18. A method, comprising:
    performing on a semiconductor structure on a wafer in a semiconductor fabrication process: a plasma dry etch process, a plasma dry strip process, a first nitridation passivation, a first wet strip clean process, a second nitridation passivation, and a second wet strip clean process; and
    performing a spacer material deposition on the semiconductor structure.

19. The method of claim 18, further comprising forming the spacer material deposition from a non-conductive material.

20. The method of claim 18, further comprising performing any of at least one of the first nitridation passivation and the second nitridation passivation while the semiconductor structure is in storage awaiting processing.

21. The method of claim 18, further comprising targeting the first nitridation passivation and the second nitridation passivation toward the bottom of the semiconductor structure.

22. The method of claim 18, further comprising flowing an elevated temperature of phosphoric acid through the semiconductor structure after the second nitridation passivation.

23. The method of claim 18, further comprising forming the second wet strip clean process from a dilution mixture of 100 to 500 parts water to 1 part hydrofluoric (HF) acid.

24. The method of claim 18, forming the nitridation passivation from a decoupled plasma nitridation (DPN).

* * * * *